US007778426B2

(12) United States Patent
McDermott et al.

(10) Patent No.: US 7,778,426 B2
(45) Date of Patent: Aug. 17, 2010

(54) FEEDBACK SUPPRESSION IN SOUND SIGNAL PROCESSING USING FREQUENCY TRANSLATION

(75) Inventors: Hugh McDermott, Mt Macedon (AU); Adam Hersbach, The Patch (AU); Andrea Simpson, Yarraville (AU)

(73) Assignee: Phonak AG, Stafa (CH)

( * ) Notice: Subject to any disclaimer, the term of this patent is extended or adjusted under 35 U.S.C. 154(b) by 940 days.

(21) Appl. No.: 10/921,550

(22) Filed: Aug. 19, 2004

(65) Prior Publication Data

US 2005/0094827 A1 May 5, 2005

(30) Foreign Application Priority Data

Aug. 20, 2003 (AU) .............................. 2003236382

(51) Int. Cl.
*H03G 5/00* (2006.01)
*H04B 15/00* (2006.01)
*H04R 3/00* (2006.01)
*H04R 27/00* (2006.01)

(52) U.S. Cl. ............................ 381/93; 381/95; 381/96; 381/98; 381/83

(58) Field of Classification Search ................... 381/83, 381/318, 93, 95, 96, 98
See application file for complete search history.

(56) References Cited

U.S. PATENT DOCUMENTS 3,894,195 A 7/1975 Kryter
4,232,192 A * 11/1980 Beex ........................... 381/83
4,731,850 A 3/1988 Levitt et al.
4,783,818 A 11/1988 Graupe et al.
4,815,140 A 3/1989 Wagner
4,845,757 A 7/1989 Wagner
4,879,749 A 11/1989 Levitt et al.

(Continued)

FOREIGN PATENT DOCUMENTS

EP 0 585 976 A2 3/1994

(Continued)

OTHER PUBLICATIONS

Bustamante, Diane K., Worall, T. L., Willamson, M.J. "Measurement and Adaptive Suppression of Acoustic Feedback in Hearing Aids," Nicolet instruments, Audiodiagnostics Division, Madison, Wisconsin, CH2673-2/89/0000-2017, IEEE, 2017-2020.

(Continued)

*Primary Examiner*—Vivian Chin
*Assistant Examiner*—George Monikang
(74) *Attorney, Agent, or Firm*—Pearne & Gordon LLP

(57) ABSTRACT

A method of processing a sound signal in an audio amplification device using frequency transposition, the method including the steps of: (a) receiving (11) an input sound signal, (b) determining (19) gains for amplifying the input sound signal at a plurality of input frequencies, (c) transposing (20) one or more of the input frequencies of the amplified sound signal to generate one or more output signals at transposed frequencies, (d) determining (31-33) the presence of an undesired feedback signal component resulting from the amplification and frequency transposition of the input sound signal at the input frequencies, and (e) correcting (34) the output signal at each of the transposed frequencies to compensate for the presence of the undesired feedback signal component.

28 Claims, 4 Drawing Sheets

U.S. PATENT DOCUMENTS

| | | | | |
|---|---|---|---|---|
| 5,091,952 | A | | 2/1992 | Williamson et al. |
| 5,259,033 | A | | 11/1993 | Goodings et al. |
| 5,412,734 | A | | 5/1995 | Thomasson |
| 5,621,802 | A | | 4/1997 | Harjani et al. |
| 5,649,019 | A | * | 7/1997 | Thomasson .................. 381/83 |
| 5,677,987 | A | | 10/1997 | Seki et al. |
| 5,680,467 | A | | 10/1997 | Hansen |
| 5,748,751 | A | | 5/1998 | Janse et al. |
| 6,072,884 | A | | 6/2000 | Kates |
| 6,252,967 | B1 | | 6/2001 | Moore et al. |
| 6,347,148 | B1 | * | 2/2002 | Brennan et al. ............. 381/318 |
| 6,404,895 | B1 | | 6/2002 | Weidner |
| 6,434,246 | B1 | | 8/2002 | Kates et al. |
| 6,434,247 | B1 | | 8/2002 | Kates et al. |
| 6,498,858 | B2 | | 12/2002 | Kates |
| 2003/0053647 | A1 | | 3/2003 | Kates |
| 2005/0271222 | A1 | | 12/2005 | Freed |

FOREIGN PATENT DOCUMENTS

| | | | |
|---|---|---|---|
| EP | 0 930 801 | A2 | 1/1998 |
| EP | 1191814 | A1 | 3/2002 |
| EP | 1278396 | A | 1/2003 |
| EP | 1480494 | A3 | 4/2006 |
| GB | 1597501 | A | 9/1981 |
| WO | 95/28034 | A2 | 10/1995 |
| WO | 00/19605 | A2 | 4/2000 |
| WO | 00/21332 | | 4/2000 |
| WO | 01/06746 | A2 | 1/2001 |
| WO | 01/06812 | A1 | 1/2001 |
| WO | 01/54452 | A1 | 1/2001 |
| WO | 01/22775 | A2 | 3/2001 |
| WO | 02/25996 | A1 | 3/2002 |
| WO | 2006/026045 | A2 | 3/2006 |

OTHER PUBLICATIONS

Chi, Hsiang-Feng, Gao, S.X. and Soli, S. D. "A Novel Approach of Adaptive Feedback Cancellation for Hearing Aids," House Ear Institute, Los Angeles, Department of Electrical Engineering, University of California, Los Angeles, 0/7803-5471-0/99 IEEE, III-195-198.

Estermann, Pius, Kaelin, August, "Feedback Cancellation in Hearing Aids: Results From Using Frequency-Domain Adaptive Filters," Institute for Signal and Information Processing Swiss Federal Institute of Technology Zurich, Switzerland; Institute of Signal and Information Processing, Swiss Federal Institute of Technology, Zurich, Switzerland, 257-260.

Hellgren, Johan, "Analysis of Feedback Cancellation in Hearing Aids With Filtered-X LMS and the Direct Method of Closed Loop Identification," IEEE Transactions of Speech and Audio Processing, vol. 10, No. 2, Feb. 2002. 119-131.

Kaelin, August, Lindgren, A., Wyrsch, S. "A Digital Frequency-Domain Implementation of a Very High Gain Hearing Aid With Compensation for Recruitment of Loudness and Acoustic Echo Cancellation" Signal Processing, Swiss Federal Institute of Technology (ETH), Signal and Information Processing Laboratory, CH-8092 Zurich, Switzerland, Department of Electrical Engineering, University of Rhode Island, Kingston, RI 02881, USA. 71-85.

Kates, James M. "Feedback Cancellation in Hearing Aids: Results From a Computer Simulation," IEE Transactions on Signal Processing vol. 39, No. 3, Mar. 1991, 553-562.

Kates, James M. "Feedback Cancellation in Hearing Aids," Center for Research in the Speech and Hearing Sciences, City University of New York, Graduate Center, CH-2847-2/90/0000-1125 IEEE.

Kates, James M. "Constrained Adaptation for Feedback Cancellation in Hearing Aids" J. Acoust Soc. Am 106 (2) Aug. 1999, 1010-1019.

Kates, James M. "Feedback Cancellation in Hearing Aids Using Constrained Adaptation" Audio Logic, Proc. 1999 IEEE Workshop on Applications of Signal Processing to Audio and Acoustics, 231-234.

Knecht, Wolfgang G. "Some Notes on Feedback Suppression With Adaptive Filters in Hearing Aids" Phonak AG.

Maxwell, Joseph A. and Patrick M. Zurich, Reducing Acoustic Feedback in Hearing Aids IEEE Transactions On Speech and Audio Processing, vol. 3. No. 4, Jul. 1995, 304-313.

Young-cheol Park, Dong-wook Kim, In-young Kim. "An Efficient Feedback Cancellation for Multiband Compression Hearing Aids," Biomedical Engineering Team, Samsung Advanced Institute of Technology, 0/7803-5164-9/98, 2706-2709.

M.G. Siqueira, R. Speece, E. Petsalis, A. Alwan. "Subband Adaptive Filtering Applied to Acoustic Feedback Reduction in Hearing Aids," Department of Electrical Engineering, University of California, Los Angeles, 1058-6393/97 IEEE, 788-792.

Rongtai Wang and Ramesh Harjani, "Acoustic Feedback Cancellation in Hearing Aids," Department of Electrical Engineering, University of Minnesota. 0-7803-0949-4/93, 1993 IEEE, I-137-I-140.

Brian D. Woodruff and David A Preves, "Fixed Filter Implementation of Feedback Cancellation for In-The-Ear Hearing Aids," Argosy Electronics, Inc.

Sigisbert Wyrsch and August Kaelin, "Adaptive Feedback Cancelling in Subbands for Hearing Aids," Swiss Federal Institute of Technology (ETH), Signal and Information Processing Laboratory. 0/7803-5041-3/99, 1999 IEEE, 921-924.

Sigisbert Wyrsch and August Kaelin, "Subband Signal Processing for Hearing Aids." Swiss Federal Institute of Technology (ETH), Signal and Information Processing Laboratory. 0/7803-5471-0/99, 1999 IEEE.

Dolson M: "The Phase Vocoder; A Tutorial," Computer Nmusic Journal, Cambradge, MA, US. vol. 10, No. 4, Dec. 21, 1986, pp. 14-27, XP009029676. figs 1,3; p. 1, lf. col.-p. 2, lf. col.; p. 7, lf. col.-p. 8, rt. col.

M.R. Schroeder, "Improvement of Acoustic-Feedback Stability by Frequency Shifting," The Journal of the Acoustical Society of America, vol. 9, Sep. 1964.

Jeremy Agnew, Ph.D. "Acoustic Feedback and Other Audible Artifacts in Hearing Aids," Trends in Amplification, vol. 1, No. 2, 1996.

* cited by examiner

FEEDBACK SUPPRESSION IN SOUND SIGNAL PROCESSING USING FREQUENCY TRANSLATION

The present invention relates generally to the processing of sound signals in audio amplification devices, and in particular to sound signal processing that involves the use of frequency translation to compensate for feedback in the audio amplification device. The present invention is suitable for use in hearing aids, and it will be convenient to describe the invention in relation to that exemplary application. It will be appreciated however, that the invention is not limited to use in that application only.

Feedback in an audio amplifier occurs when the acoustic signal from the output transducer finds its way back to the input transducer of the amplifier, thus creating a feedback loop. In audio amplifiers such as hearing aids, feedback can result in audible whistling or howling. Under these conditions, the closed loop gain of the amplifier is unstable and approaches infinity at the frequency where certain gain and phase requirements are met. If the forward gain of the amplifier is equal to or larger than the attenuation of the feedback path, then the system will oscillate at the frequency or frequencies where the phase change of the system is an integer multiple of 360°.

Sub-oscillatory feedback occurs when the forward gain of the amplifier is slightly less than the attenuation of the feedback path. Under these conditions, the closed loop gain of the amplifier becomes highly non-linear at frequencies where the phase change is an integer multiple of 360°. Even though the amplifier in a hearing aid does not howl, the high gain at potential feedback frequencies can cause audible artefacts often described as ringing. In order to ensure that a high quality audio output signal is generated, it is necessary to avoid operating the amplifier in an oscillatory or sub-oscillatory feedback situation.

In a hearing aid, feedback occurs when the sound delivered to the ear canal leeks back to the microphone input. There are many feedback paths for sound to take, the most significant of which is via an open vent in the ear mould although other paths such as gaps between the ear mould of the hearing aid and the ear, do exist. When fitting a hearing aid with a very high gain, it would be desirable to completely block the vent to improve feedback problems due to the high gain. However, it is not practical to completely block the ear mould vent for several reasons. Blocking the vent completely causes ear occlusion resulting in changes to the sound of the wearer's own voice. Moreover, blocking the vent prevents air flow needed for hygiene and comfort of the wearer, and reduces the transmission of unaided low frequency sounds into the ear.

A theoretical model of a hearing aid system is shown in FIG. 1. In this Figure, H is the forward transfer function of the hearing aid amplifier, and G is the transfer function of all combined feedback paths. If there is a vent in the ear mould, the transfer function G is dominated by the feedback path via the open vent. Both transfer functions H and G are complex functions of frequency. In order to minimise the above described problems resulting from the feedback loop in the model shown in this figure, various types of feedback cancellation systems have been proposed.

Typical feedback cancellation systems are based on altering either the gain or the phase of the sound signal over the range of frequencies where feedback occurs. However, reduction of gain over a wide range of frequencies is not advantageous if the amplifier does not achieve the desired output level. Using a feedback detection algorithm, narrow band high intensity sounds can be detected and interpreted as the onset of feedback oscillation. A tuneable notch filter can be used to reduce the gain over a narrow frequency range, cantered on the detected frequency. Some feedback cancellation systems employ several tuneable notch filters in a situation where the closed loop gain becomes unstable at several frequencies simultaneously.

A significant problem with most currently available feedback cancellation systems is that they reduce the gain of the amplifier to avoid feedback. In order to preserve the intended hearing aid output level, it is preferable to reduce the gain over a narrow range of frequencies only, rather than a wide range. As the overall gain of the amplifier is increased, additional unstable feedback frequencies are created and there may not be a sufficient number of notch filters to cancel them all. The number of notch filters must be limited so that the filter frequencies do not start to overlap and act as wide band filters. A common feature of modern hearing aids is amplitude compression which applies more gain to low input levels than high input levels. This feature makes feedback more likely in quiet situations because of the increased gain. Many feedback detection algorithms detect the onset of feedback oscillation, but not necessarily sub-oscillatory gain changes. The characteristics of the feedback path are continually changing and are different for every wearer so detection of feedback needs to be adaptive to those changes.

In order to address these concerns, the use of frequency translating amplifiers has been proposed. A frequency translating amplifier is one which shifts the frequency of the input sound signal, either upward or downward, in addition to amplifying the signal before sending it to the output transducer. One such frequency translating amplifier is described in pending Australian Patent Application No 2002300314, filed 29 Jul. 2002 in the name of Hearworks Pty Ltd. The manner in which a frequency translating amplifier operates is illustrated by the model shown in FIG. 2.

In this model, a frequency shifting component referenced T is added to the output of the forward path transfer function of the simple closed loop feedback system shown in FIG. 1. The frequency of the amplified external signal is translated to a different frequency. The receiver output, and hence the feedback signal, is now at a different frequency from that of the external input signal so that successive summation of a signal at the microphone input at a particular frequency cannot occur. The introduction of the frequency shifting component to the system with $|GH|=1$ makes the closed loop gain of the system stable and stops spontaneous oscillation. The amount of frequency shift required is very small, and may typically be in the order of 5 Hertz for a frequency transposition public address system.

Frequency translation makes an amplifier stable for the same gain that would otherwise cause instability, and hence howling, without frequency shifting. A frequency translating hearing aid may be stable in terms of its closed loop gain, but when the hearing aid forward gain is equal to or greater than the attenuation of the feedback path, unwanted artefacts are introduced which decrease the quality of the sound. By way of example, we will consider the case where $|H|=|G|=40$ dB for all frequencies and the component T shifts all frequencies down by 1 octave, or a factor of 0.5, while maintaining the same amplitude level.

In the case of an external signal with frequency 2000 Hz and sound pressure level of 60 dB, the signal will be amplified by the forward transfer function H to give a sound pressure level of 100 dB, and then translated down by 1 octave to 1000 Hz. The receiver output would therefore be 1000 Hz at 100 dB. Via the feedback loop, the signal will be attenuated by the feedback transfer function G and arrive back at the microphone input at 60 dB and at 1000 Hz. This signal is then amplified and frequency shifted again to produce an output at 500 Hz and 100 dB. This signal will be attenuated by the feedback loop and reach the microphone input at 60 dB and at 500 Hz. Under these conditions, the cycle will continue until the frequency of the feedback signal falls below the input frequency range of the amplifier. However, if the amplifier forward gain H is adjusted to make |H| larger than the feedback attenuation for all frequencies, then the amplitude of the feedback signal at lower frequencies actually has a greater amplitude than the original input sound signal at those lowered frequencies.

It would therefore be desirable to provide a method and device for processing sound signals in an audio amplification device using frequency translation that removes or compensates for the presence of such feedback signals at lowered frequencies.

It would also be desirable to provide a method and device for processing sound signals in an audio amplification device using frequency translation that ameliorates or overcomes one or more problems of known frequency translation amplifiers.

With this in mind, one aspect of the present invention provides a method for processing a sound signal in an audio amplification device using frequency translation, the method including the steps of:

(a) receiving an input sound signal, (b)determining gains for amplifying the input sound signal at a plurality of input frequencies, (c) translating one or more of the input frequencies of the amplified sound signal to generate one or more output signals at translated frequencies, (d) predicting the presence of an undesired feedback signal component resulting from the amplification and frequency translation of the input sound signal at the input frequencies, and (e) correcting the output signal at each of the translated frequencies to compensate for the presence of the undesired feedback signal component.

In one embodiment of the invention, step (e) may be selectively performed if the output signal level is greater than a predetermined activation level.

The method may further include the step of computing the difference between the output signal level and the predetermined activation level in terms of acoustic power. Alternatively, the difference between the output signal level and the predetermined activation level may be computed in terms of decibels.

In one or more embodiments of the invention, the output signal may be corrected in step (e) by subtracting the undesired feedback signal component from the output signal at each of the translated frequencies to compensate for the presence of the undesired feedback signal component. In this case, the method may further include the step of, at step (e), subtracting the difference between the output signal level and the predetermined activation level from the output signal.

In another alternative, the output signal may be connected in step (e) by reducing the amplification level for amplifying the input sound signal at each of the transposed frequencies to compensate for the presence of the undesired feedback signal component.

In yet another alternative, the output signal may be corrected in step (e) by subtracting the undesired feedback signal component from the input sound signal at each of the translated frequencies to compensate for the presence of the undesired feedback signal component.

The output signal may be corrected in step (e) after a predetermined delay corresponding to a processing delay between input sound signal sampling and generation of the output signals. The method may further include the storing a feedback correction value to compensate for the presence of the undesired feedback signal component in a data storage device and applying the feedback correction value in step (e). The data storage device may be a circular device may be a circular buffer having a buffer length set to output the feedback correction value after the predetermined delay.

The amplified input sound signals at each of the plurality of input signals may be synthesised by an oscillator. Estimates of the input frequencies and translated frequencies may be computed by use of a phase vocoder technique.

Alternatively, the amplified input sound signals at each of the plurality of input frequencies may be synthesised by performing an inverse Fourier transfer on a set complex frequency domain values. In this case, step (e) may be carried out by correcting the complex frequency domain values before inverse Fourier transformation is performed.

Another aspect of the invention provides a sound processing device including:

amplification means for amplifying an input sound signal and a plurality of input frequencies, frequency translation means for translating one or more of the input frequencies of the amplified sound signal to generate one or more output signals at translated frequencies, and processing means for determining the presence of an undesired feedback signal component resulting from the amplification and frequency translation of the input sound signal at the input frequencies, and correcting the output signal at each of the translated frequencies to compensate for the presence of the undesired feedback signal.

The processing means may further act to selectively correct the output signal if the output signal level is greater than a predetermined activation level. The processing means may compute the difference between the output signal level and the predetermined activation level in terms of acoustic power. Alternatively, the processing means may compute the difference between the output signal level and the predetermined activation level in terms of decibels.

In one or more embodiments, the processing means may further act to correct the output signal by subtracting the undesired feedback signal component from the output signal at each of the transposed frequencies to compensate for the presence of the undesired feedback signal component. In this case, the processing means may act to subtract the difference between the output signal level and a predetermined activation level from the output signal level. In other embodiments, the processing means may act to connect the output signal by reducing the gain for amplifying the input sound signal at each of the translated frequencies to compensate for the presence of the undesired feedback signal component. In yet other embodiments, the processing means may further act to subtract the difference between the output signal level and a predetermined activation level from the input sound signal at each of the translated frequencies to compensate for the pressure of the undesired feedback signal.

The sound processing device may further including a data storage device, and the processing means may further act to store a feedback correction value to compensate for the presence of the feedback signal in a data storage device, and apply the feedback correction value. The data storage device may be a circular buffer having a buffer length set to output the feedback correction value after the predetermined delay.

The sound processing device may include a bank of oscillators, wherein each oscillator synthesises the amplified input sound signals at one or more of the plurality of input sound signals.

The processing means may further act to compute estimates of the input frequencies and translated frequencies by use of a phase vocoder technique.

The processing means may further act to synthesise the amplified input sound signals at each of the plurality of input frequencies by performing an inverse Fourier transform on a set of complex frequency domain values, and correct the output signal at each of the translated frequencies by correcting the complex frequency domain values before inverse Fourier transformation is performed.

The following description refers in more detail to the various features of the sound signal processing method and device of the present invention. To facilitate an understanding of the invention, reference is made in the description to the accompanying drawings where the method and device for processing a sound signal is illustrated in a preferred embodiment. It is to be understood that the invention is however not limited to the preferred embodiment illustrated in the drawings.

Figure 3:
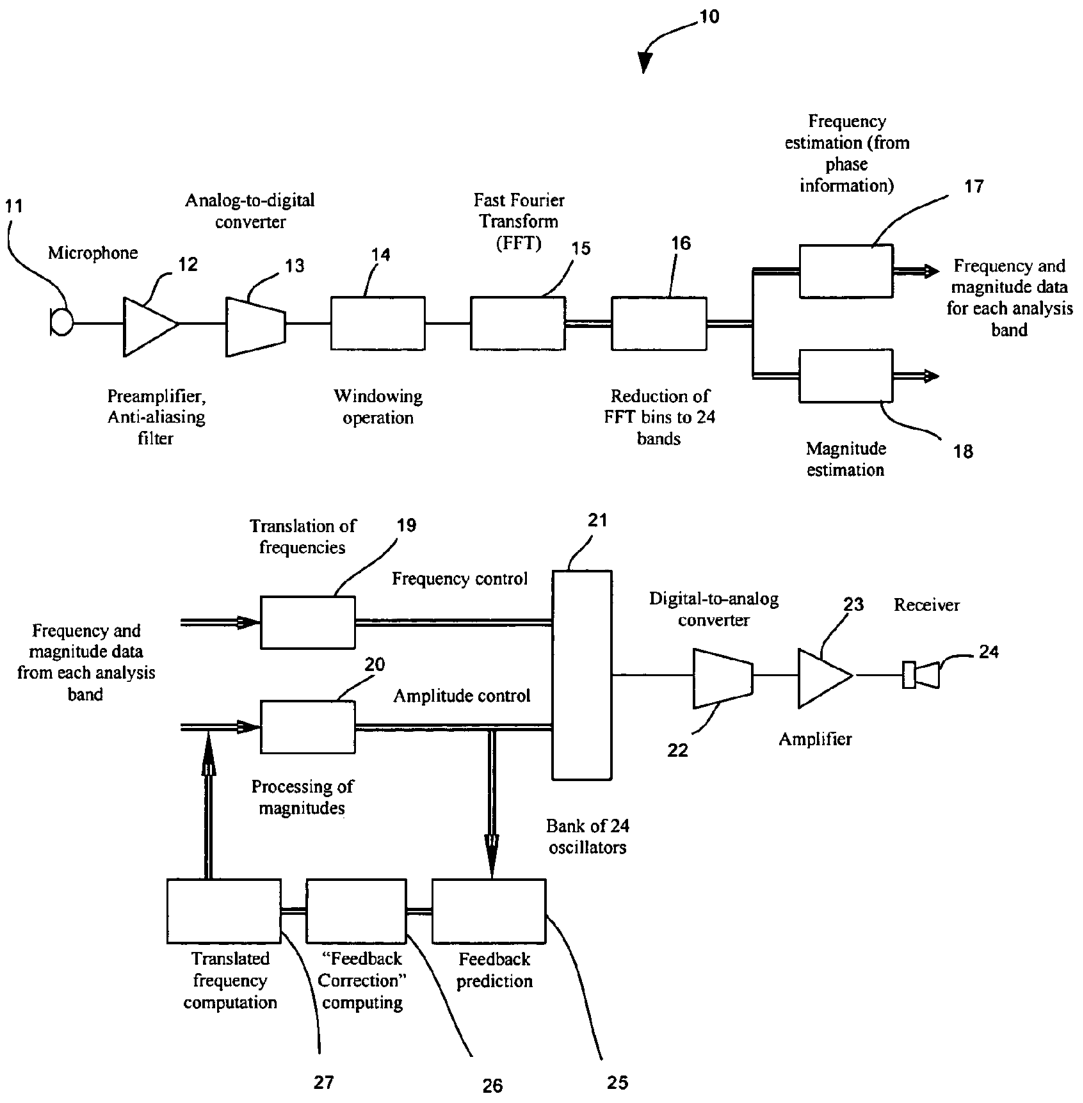
FIG. 3 is a schematic diagram of an embodiment of a sound processing device using frequency translation in accordance with one embodiment of the present invention.

Referring now to FIG. 3, there is shown generally a sound processing device 10 in which input signals from a microphone are sampled, converted to a digital representation, and then periodically subject to a windowing operation followed by a Fast Fourier Transform (FFT). The result of the FFT is analysed to estimate the magnitude and phase of each frequency component of the input signal. The magnitudes are processed to produce amplitude control signals which are assigned to a number of oscillators. These oscillators are tuned to appropriate frequencies using information derived from the changes over time in the phase estimates. The final output signal is constructed by summing the output signals for the oscillators, and subsequently converting the composite signal from digital to analogue form. The composite output signal is then conveyed to a suitable transducer, such as the earphone (receiver) of a hearing aid.

In more detail, an input sound signal received at a microphone 11 is preamplified and filtered to limit its bandwidth in the preamplifier and anti aliasing filter. An analogue to digital converter 13 samples the band limited signal at a constant rate and converts the sampled signal into digital form. In the exemplary implementation of the present invention, a block of sequential input samples is placed in the memory of a suitable digital signal processing (DSP) unit. These samples are windowed by a windowing block 14 which multiplies each sample by a corresponding coefficient. Various windowing functions defining suitable sets of coefficients have been described in the literature readily available to those skilled in the art. The purpose of the window is to ensure that the subsequent FFT operation performed by an FFT block 15 produces an acceptable estimate of the short term spectrum of the input signal without noticeable distortion or other undesirable side-effects.

The Applicants have found that a 256 point window with coefficients defined by the product of a hamming window and a mathematical sinc function is suitable when an input sampling rate of 14.4 kHz is used. The window of outputs are stacked and added (using a standard numerical operation known as folding) to produce a set of windowed input samples. This set of data is then processed by the 128 point FFT block 15.

Figure 1:
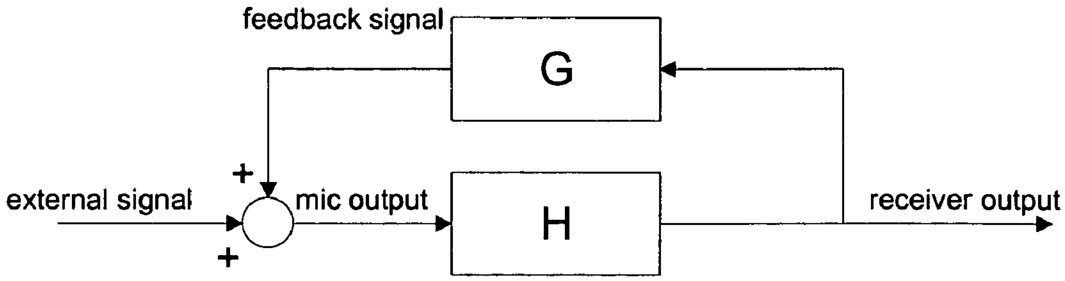
FIG. 1 is a schematic diagram illustrating a model of an acoustic amplification device including a forward transfer path and a feedback path.
Figure 2:
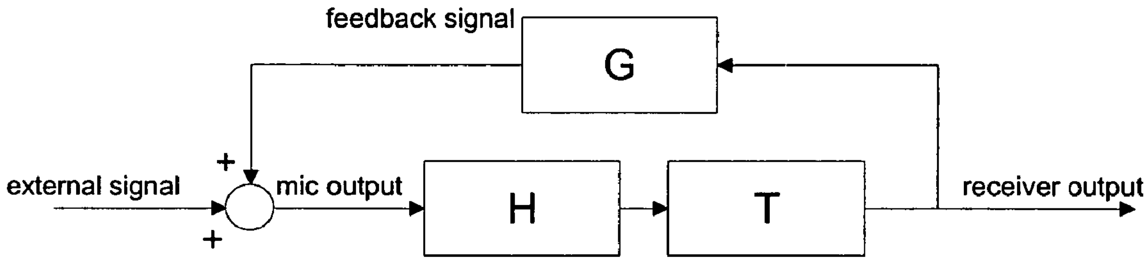
FIG. 2 is a schematic diagram illustrating a model of an acoustic amplification device using frequency translation to minimise the effect of feedback.

The FFT and subsequent processing performed by the sound processing device of FIG. 1 are executed every time a new set of 32 samples has been obtained from the input transducer. Thus, with the sampling rate of 14.4 kHz, the FFT and subsequent processing steps are repeated at intervals of approximately 2.2 ms. However, it will be appreciated that differing sampling rates, different types and links of the window function and Fourier transform, and different extents of FFT overlap may be envisaged.

The outputs of the FFT block 15 comprise a set of complex numbers which together represent approximately a short term spectrum of the input signal. With a 128 point FFT, the first 64 bins contain spectral estimates covering the frequency range of zero to 7.2 kHz, approximately (for a sampling rate of 14.4 kHz). Ignoring the first and last of these bins, which generally do not contain signals of interest in the present exemplary hearing aid implementation of the sound processing device, the remaining bins each provide information about a substantially contiguous sub band of the input frequency range, each bin extending over a bandwidth of approximately 112.5 Hz. For example, the first bin of interest contains a complex number which describes the real and imaginary components of the input signal—within a bandwidth of approximately 112.5 Hz centred on a frequency of 112.5 Hz. The power of each component of the input signal is estimated for each frequency bin by summing the squares of the real and imaginary parts of the complex estimate.

A well known deficiency for the FFT for spectral analysis in general is that the output bins are spaced at constant frequency intervals (e.g. 112.5 Hz in the present case, and have a constant band width, e.g. approximately 112.5 Hz). For the purposes of frequency transposition as outlined above, it is desirable to obtain a more precise estimate of the frequency content of the input spectrum than is possible using FFT alone, especially at relatively low frequencies. As is described in co-pending Australian Patent Application No 2002300314, filed 29 Jul. 2002 in the name of Hearworks Pty Ltd, this can be achieved by making use of information contained in the phase value represented in each frequency bin at the output of the FFT block 15. This extension of the standard FFT process is embodied in an algorithm described as a phase vocoder.

Firstly, the phase angle is estimated by calculating the inverse tangent of the quotient of the imaginary and real parts of the complex number in each FFT bin. A look-up table is provided containing the pre-calculated tangents of a relatively small number (e.g. 64) of phase values. This table contains discrete samples of the range of possible phase values over any two quadrants (e.g. for phase values between $-\pi/2$ and $+\pi/2$ radians). These values correspond to the case where the real part of the complex number from the FFT bin is positive. If the real part is in fact negative, it is firstly treated as positive, and later the phase estimate is corrected by adding an appropriate constant to the phase angle initially calculated.

The phase value for each FFT bin is estimated by a process of successive approximation. A starting value for the phase angle being sought is selected, and the tangent of that value is obtained from the look-up table. The tangent of the candidate phase value is then multiplied by the imaginary part of the complex number in the FFT bin. The product is then compared with the corresponding real part, and the candidate phase value is adjusted up or down according to the difference between the estimated and actual real path.

Next the new candidate value is used to obtain the corresponding tangent from the look-up table. This process is repeated until the candidate phase value has the desired accuracy. It has been found that adequate precision can be obtained with a 64 entry look-up table encompassing a phase range of $-\pi/2$ to $+\pi/2$. Because multiplication and table look-ups can be carried out very rapidly and efficiently in current DSP devices, the above described algorithm is particularly suitable for use in a wearable, digital hearing aid.

To use the phase estimates to improve the resolution of the frequency analysis provided by the FFT, the rate of change of the phase in each FFT bin over time is estimated. This is because the rate of phase change in a particular bin is known to be proportional to the difference in frequency between the dominant component contained in that bin and the nominal centre frequency of the bin. In this implementation, the rate of phase change for each bin is calculated by subtracting the phase estimates obtained from the immediately previous FFT operation from the current phase estimates. Phase differences are accumulated over time, and then multiplied by a suitable scaling factor to represent the frequency off-set between the input signal component dominating the content of each FFT bin and the corresponding centre frequency for that bin. It will be appreciated that alternative processes to determine the phase estimates may be used, for example, a direct calculation process.

The processing described thus far results in a set of power estimates representing the square of the magnitude spectrum of the input signal, and a set of precise frequency estimates representing the dominant components present in the input signal. These sets comprise one power value and one frequency value for each FFT bin. These sets normally contain 62 power and frequency values assuming that a 128 point FFT is employed.

In the present example, a bank of 24 oscillators is used in the sound processing device 10. In FIG. 3, the bank of oscillators is indicated by the reference 21. The information contained in the 62 FFT bins is reduced to 24 bands in the reduction block 16, with each band assigned to a corresponding oscillator. The frequency range covered by the 24 bands are normally, but not necessarily, contiguous. The reduction of the FFT bins to a smaller number of bands may be accomplished in various ways. One practical technique is to exploit the fact that less frequency resolution is generally needed in an assistive hearing device at high frequencies than at low frequencies. Thus the contents of several relatively high frequency FFT bins can be combined into a single processing band. The combining operation is performed by summing powers of the FFT bins, and by obtaining the required precise frequency estimate from only one of the combined bins. The bin selected for this purpose is the one containing the highest power out of the set of combined bins. For low frequency FFT bins, each bin is usually assigned separately to a corresponding band for further processing.

The outputs of each of the 24 bands are then analysed by a frequency estimation block 17 and a magnitude estimation block 18 to derive an estimate respectively of the frequency and magnitude of each of the 24 bands of the input signal. The frequency estimation is derived from phase information provided by the reduction block 16.

Frequency and magnitude data for each analysis band are provided to a frequency transposition block 19 and magnitude processing block 20. Each of the 24 oscillators in the sound processing device 10 generates a sine wave that can be controlled in both amplitude and frequency. The desired amplitude is determined by the magnitude processing block 20 from the magnitude data for the corresponding band. The conversion between the power value and the desired oscillator amplitude may be specified by a look-up table or calculated from an appropriate equation. Accordingly, any desired amount of amplification or attenuation of the input signal may be achieved at each frequency (i.e. within the frequency range associated with each band).

The desired oscillation frequency of each oscillator is set by the frequency translation block 19 and may be specified by a look-up table or calculated from an equation. For example, if no change to the frequencies present in the input signal is required, each of the oscillators is merely tuned to generate the same frequency as that estimated from input signal in the corresponding band as determined by the frequency estimation block 17. However, if frequency translation is required to be formed by the frequency translation block 19 (for example, lowering of one or more input frequencies by 1 octave), then the frequency estimated from the input signal in each band is multiplied by an appropriate factor (for example, 0.5) before applying it to tune the corresponding oscillator. It should be noted that both the amplitude control and the frequency control for each oscillator can be specified completely independently of the operation of all other oscillators. Thus it is possible to lower some input frequencies and not others, or to lower each input frequency by a different amount. It will be appreciated that it is also possible to raise input frequencies in the same manner.

Accordingly, amplitude control signals are provided from the magnitude processing block 20 to each of the 24 oscillators in the bank of oscillators, whilst frequency control information is provided from the frequency translation block 19 to that same bank of oscillators.

The composite output signal is produced by summing the output signals from the bank of all 24 oscillators. The composite signal is then converted to analogue form by the digital to analogue converter 22 and amplified by amplifier 23 to drive a suitable transducer 24 (such as the earphone of a hearing aid or other receiver).

According to the present invention, feedback artefacts resulting from the frequency translation carried out in the sound processing device 10 are compensated for or removed. Given the input to output frequency mapping employed by the sound processing device 10, it is possible to predict the frequency of the feedback signal produced by any given external signal. The time delay between the original external signal and its corresponding frequency lowered feedback signal can also be accurately predicted and is directly related to the signal processing delay of one complete loop around the system.

The output signal level at the input frequency of each of the 24 bands is accordingly monitored by a feedback prediction block 25 to determine if it is above or below a predefined activation level. If the output signal level is above the activation level, a feedback correction block 26 computes the difference between the output signal level and the predetermined activation level in terms of acoustic power. In alternative embodiments of the invention, the difference may be computed in terms of decibels.

In the translated frequency computation block 27, the translated frequency at which the undesired feedback signal component will occur is calculated, and the calculated difference is used to effectively "correct" the output signal at that translated frequency to compensate for the presence of the undesired feedback signal component. In the context of the present invention, "translation" is to be understood as encompassing any form of frequency modification including, for example, frequency shifting, frequency compression and any shift in frequency from a first to a second value.

The activation level is an estimate of the output signal level which will result in a feedback signal which, when amplified and transposed, will be audible or otherwise create a perceptual disturbance to the listener. A set of activation levels are required by the feedback detection block 25 to activate the feedback suppression at the frequency of each of the 24 bands. The characteristics of the feedback path may be different for each situation, and may change over time. Accordingly, the activation levels may be fixed or may be adaptable to change according to changes in the characteristics of the feedback path over time.

Figure 4:
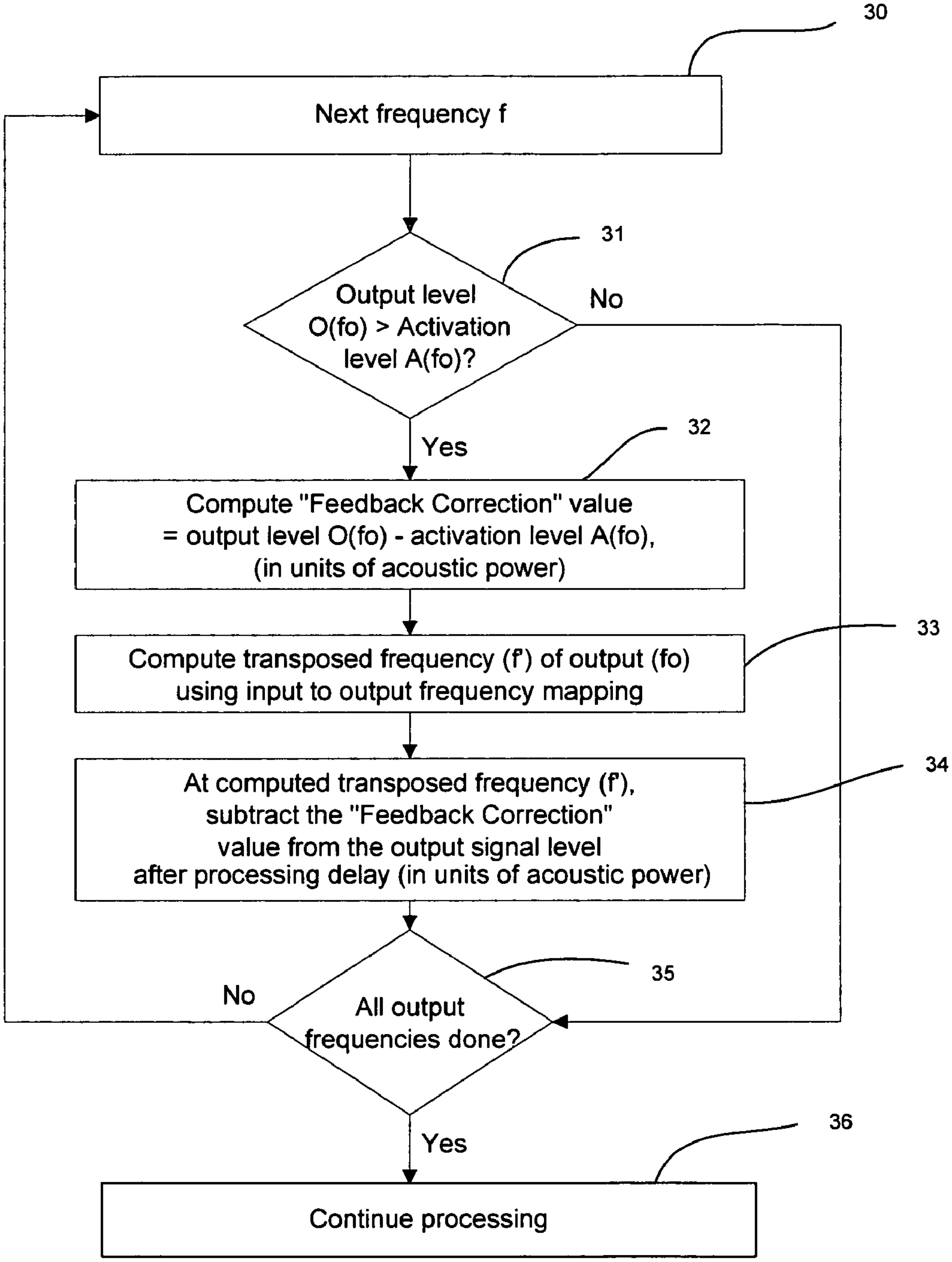
FIG. 4 is a flow chart showing functional steps performed by part of the sound processing device of FIG. 3.

FIG. 4 illustrates in more detail the operation of the sound processing device 10 during suppression of an undesired feedback signal component resulting from frequency translation. At step 30, a first frequency of an output signal intended to drive one of the oscillators in the bank is analysed. At step 31, the output signal level at that output frequency is compared with the activation level. If the output signal level is below the activation level, there is no need to perform any feedback suppression at that frequency, and processing moves on to the next output frequency. If however, the output signal level is above the activation level, the difference between them is calculated at step 32 in terms of acoustic power. At step 33, the translated frequency of the undesired feedback signal component is computed using input to output frequency mapping. This computation determines the frequency at which the undesired feedback signal component is effectively applied as an additional input signal to one of the oscillators in the bank.

In step 34, at the computed translated frequency, the feedback correction value is subtracted from the output signal level after an appropriate delay dependent on the processing delay of the amplifier. At step 35, a determination is made as to whether all output frequencies have been analysed, and if so, processing is continued by other elements of the sound processing device 10 at step 36. The quantity that is subtracted from the output signal level is best done in terms of acoustic power (squared linear amplitude). However, due to programming efficiency, it may be more advantageous to perform computations in terms of decibels in some situations, for example when the total signal level is not greatly above the audibility threshold at the expected feedback frequency.

If the activation level is set to low, feedback suppression will cause the amplifier to reduce the output level at a given transposed frequency, even when no feedback signal is present. This may result in a reduction of the wanted signal even if there was one present at that frequency. If the activation level is set to high, feedback artefacts will be present at the transposed frequency, and may be audible.

In the described embodiment of the invention, the undesired feedback signal component is subtracted from the output signal at each of the translated frequencies to compensate for the pressure of the undesired feedback signal component. However, it will be appreciated by those skilled in the art that in alternative embodiments, the undesired feedback signal component may be subtracted from the input sound signal, prior to amplification and frequency translation, in order to achieve the same connection of the output signal.

In yet other alternative arrangements, the gain for amplifying the input sound signal at each of the translated frequencies may be reduced to compensate for the undesired feedback signal component.

In a preferred embodiment of the invention, the sound processing device is implemented according to digital signal processing techniques. As described above, the input signal is windowed and processed as a block of data every 2.2 ms which corresponds to 32 input data samples at a sampling rate of 14.4 kHz. The output signal of the amplifier 23 is generated by summing together the outputs of the 24 oscillators in the bank. The amplitude and frequency controls of the oscillators are determined by pre-processing of the input signal and are updated once for every block of data analysed.

Figure 5:
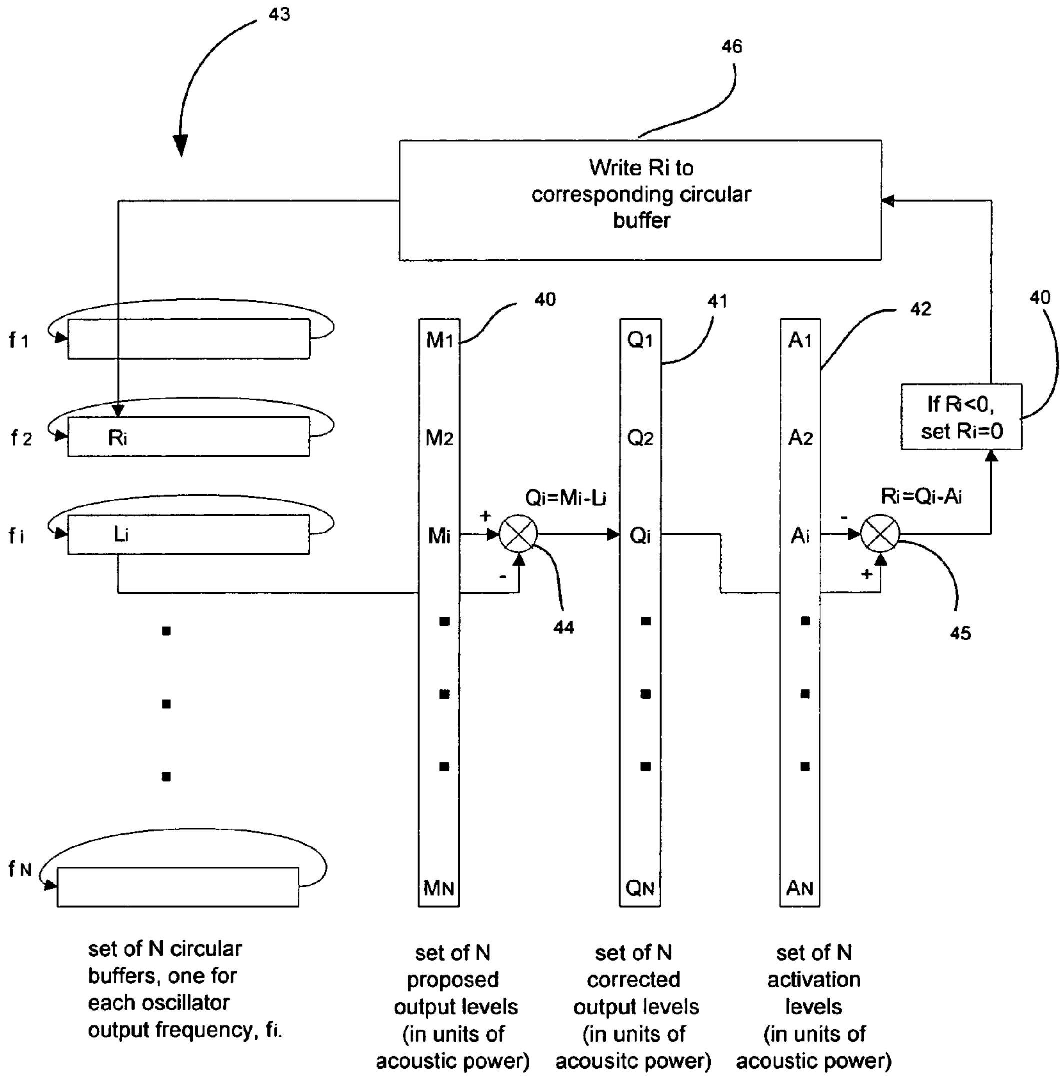
FIG. 5 is a more detailed view of part of the sound processing device of FIG. 3 illustrating the manner in which undesired feedback signal components are compensated for in the sound processing device of FIG. 3.

FIG. 5 shows an exemplary implementation of some elements of a digital signal processor for performing such techniques. An array 40 of N proposed output levels, an array 41 of N corrected output levels and an array 42 of N activation levels are maintained by the sound processing device 10. A set 43 of circular buffers, each corresponding to one of the proposed output, corrected and activation levels is also maintained. As can be seen from this figure, the squared linear amplitude (acoustic power) Qi of each of the oscillators in the bank is initially compared to the activation level Ai in terms of acoustic power by a comparator 45. The difference Ri between the values Qi and Ai is called the "feedback correction" level in units of acoustic power.

The set 43 of circular buffers are implemented to store the "feedback correction" data. N circular buffers are provided, one for each oscillator frequency, and are referenced f1, f2 . . . fN in order of increasing frequency. One data point for each oscillator is stored for each block of 32 data samples analysed, and a history of the appropriate length is kept. In a practical embodiment of the invention, the processing time from input sample to output sample is approximately 20 ms. The circular buffer holds one data point for every 2.2. ms, so a buffer of length 10 will hold 22 ms of "feedback correction" data history. The proposed output for each oscillator Mi is adjusted by a comparator 44 by reading the "feedback correction" value Li for that oscillator frequency from the relevant circular buffer. This corrected output level Qi is stored and used to control the oscillator amplitude.

Subsequently, a new "feedback correction" value is computed based on the activation level and the corrected output level. The "feedback correction" value is stored in the same circular buffer history position, but now in the buffer corresponding to the transposed frequency. The feedback correction value to be stored is labelled Ri and is written to the corresponding circular buffer in step 46. The position in the circular buffer is incremented for each block of data processed, and after 10 blocks of data (22 ms) a full cycle is completed.

The above described implementation assumes the output signal of the amplifier is synthesised with a set of sine wave oscillators. The feedback suppressor acts by reducing the amplitude of the given oscillator frequency when the feedback is expected to be present.

This feedback suppression algorithm is also effective on an amplifier processing strategy that does not use oscillators to synthesise the output signal. For example, if the output signal is synthesised by performing an inverse Fourier transform on a set of complex frequency domain values, then the feedback suppression algorithm can be applied to the frequency domain values before inverse transformation takes place. The acoustic power of the complex frequency domain values can be obtained by summing the squared real and imaginary components and adjusting the same components in the manner described above. Finer frequency estimates than whole FFT bin width estimates may be used to enhance the operation of the feedback canceller. One method of obtaining finer frequency estimates is to use a phase vocoder technique, as has been described above. The output signal is then synthesised using a bank of sine wave oscillators as described above.

In the case where several output frequencies map to the same feedback frequency, the highest feedback correction value Ri can be selected or alternatively all contributing Ri values can be summed as linear amplitudes and the squared linear amplitude (acoustic power) written to the buffer.

In the digital signal processing arrangement described in relation to FIG. 5, if the frequency transposition is set to shift frequencies downwards, then this processing strategy should start with the frequency f1 and finish with the frequency fN. In the case that frequency shifting is in the upward direction, processing should begin with the frequency fN and finish with the frequency f1. This will avoid overwriting the feedback correction values Li with feedback correction values Ri before they have been used.

Many modern digital hearing aids implement non-linear gain control, resulting in soft input sounds being amplified more than loud input sounds. For example, at a low input level, an increase of 10 dB of the input signal may result in an increase of 20 dB in the output level, and at a high input level, an increase of 10 dB may result in a 5 dB increase in the output level. This output of non-linear gain tends to result in increased feedback issues in quiet environments because of the increased gain. The present invention is suitable for use with an amplifier with a non-linear gain and is not reliant on the time course over which the non-linear gain control is operational. The "feedback correction" is computed in the same way as described above, but before it is applied to the transposed frequency, may be scaled depending on the known non-linear gain that will be applied to that input signal level. In an alternative embodiment, the "feedback correction" value may be applied to the input signal before it undergoes any other processing in the amplifier.

The above-described embodiment of the sound processor 10 may be implemented by digital signal processing techniques, using processing means to perform the various computations and control the operation of the various other elements of the sound processor 10. It will be appreciated that although a substantially digital implementation of the sound processing device and method has been described above, some or all of the elements or processing stages may be implemented using other techniques, such as by use of analogue electronic circuits. For example, the oscillators may be implemented using appropriate analogue circuits, resulting in a reduction in the electrical power requirements of the processing system, and therefore providing benefits for a practical implementation in a wearable hearing aid.

Many other variations may be made to the above described method and device for processing sound signals without departing from the spirit or ambit of the invention. For example, although no detailed implementation has been described, the present invention may have application to areas of sound processing other than hearing aids.

The invention claimed is:

1. A method of processing a sound signal in an audio amplification device using frequency translation, the method including the steps of:

(a) receiving an input sound signal, (b) processing the received sound signal into a plurality input spectral components wherein each input spectral component having a corresponding input frequency;

(c) determining gains for amplifying a plurality of the input spectral components at their corresponding input frequency, (d) determining a plurality of output spectral components from the amplified input spectral components, each output spectral component having a corresponding output frequency, and said determining step including translating the input frequency of at least one amplified input spectral component to a different frequency to determine a corresponding output frequency for the corresponding output spectral component;

(e) predicting, at the input frequencies, an undesired feedback signal component that will result from the amplification and frequency translation of an input spectral component, and (f) correcting the output spectral component of the output signal at its translated frequency to compensate for the predicted undesired feedback signal component.

2. A method according to claim 1, and further including the step of:

selectively performing step (f) if the output signal level is greater than a predetermined activation level.

3. A method according to claim 2, and further including the step of: computing the difference between the output signal level and the predetermined activation level in terms of acoustic power.

4. A method according to claim 2, and further including the step of:

computing the difference between the output signal level and the predetermined activation level in terms of decibels.

5. A method according to claim 1, wherein the output signal is corrected in step (f) by:

subtracting the undesired feedback signal component from the output signal at each of the translated frequencies to compensate for the pressure of the undesired feedback signal component.

6. A method according to claim 5, and further including the step of:

at step (f), subtracting the difference between the output signal and a predetermined activation level from the output signal.

7. A method according claim 1, wherein the output signal is corrected in step (f) by:

reducing the gain for amplifying the input spectral component at each of the translated frequencies to compensate for the presence of the undesired feedback signal component.

8. A method according to claim 1, wherein the output signal is corrected in step (f) by:

subtracting the undesired feedback signal component from the corresponding input spectral component at each of the translated frequencies to compensate for the presence of the undesired feedback signal component.

9. A method according to claim 1, wherein the output signal is corrected in step (f) after a predetermined delay corresponding to a processing delay between input sound signal sampling and generation of the amplified sound signals.

10. A method according to claim 9, and further including the step of:

storing a feedback correction value to compensate for the presence of the feedback signal in a data storage device, and applying the feedback correction value in step (f).

11. A method according to claim 10, wherein the data storage device is a circular buffer having a buffer length set to output the feedback correction value after the predetermined delay.

12. A method according to claim 1, wherein the amplified input spectral components at each of the plurality of input frequencies are synthesised by an oscillator.

13. A method according to claim 12, wherein estimates of the input frequencies and translated frequencies are computed by use of a phase vocoder technique.

14. A method according to claim 1, wherein the amplified input spectral components at each of the plurality of input frequencies are synthesised by performing an inverse Fourier transform on a set of complex frequency domain values, and wherein step (f) is carried out by correcting the complex frequency domain values before inverse Fourier transformation is performed.

15. A sound processing device, including:

amplification means for amplifying a plurality of spectral components of a received input sound signal, each of said spectral components being at a corresponding input frequency;

frequency translation means for translating the frequency one or more spectral components of the input sound signal to a different output frequency to generate a plurality of output spectral components of the output signal, and processing means for predicting the presence of an undesired feedback signal component, at the input frequencies, that will result from the amplification and frequency translation of a spectral component of the input sound signal, and for correcting the corresponding output spectral component of the output signal at its translated frequency to compensate for the prediction of the undesired feedback signal component.

16. A sound processing device according to claim 15, wherein the processing means further acts to selectively correct the output signal if the output signal level is greater than a predetermined activation level.

17. A sound processing device according to claim 16, wherein the processing means further acts to compute the difference between the output signal level and the predetermined activation level in terms of acoustic power.

18. A sound processing device according to claim 16, wherein the processing means further acts to compute the difference between the output signal level and the predetermined activation level in terms of decibels.

19. A sound processing device according to claim 15, wherein the processing means further acts to correct the output signal by subtracting the undesired feedback signal component from the corresponding output spectral component of the output signal at each of the transposed frequencies to compensate for the presence of the undesired feedback signal component.

20. A sound processing device according to claim 19, wherein the processing means further acts to subtract the difference between the output signal level and a predetermined activation level from the output signal level.

21. A sound processing device according to claim 15, wherein the processing means further acts to correct the output signal by reducing the gain for amplifying the input spectral component of the input sound signal at each of the translated frequencies to compensate for the pressure of the undesired feedback signal component.

22. A sound processing device according to claim 15, wherein the processing means further acts to correct the output signal by subtracting the undesired feedback signal component from the input sound signal at each of the translated frequencies to compensate for the presence of the undesired feedback signal component.

23. A sound processing device according to claim 15, wherein the processing means further acts to correct the output signal after a predetermined delay corresponding to a processing delay between input sound signal sampling and generation of the amplified sound signals.

24. A sound processing device according to claim 23, and further including a data storage device, wherein the processing means further acts to store a feedback correction value to compensate for the presence of the feedback signal in a data storage device, and apply the feedback correction value.

25. A sound processing device according to claim 24, wherein the data storage device is a circular buffer having a buffer length set to output the feedback correction value after the predetermined delay.

26. A sound processing device according to claim 15, and further including a bank of oscillators, wherein each oscillator synthesises a spectral component of the amplified input sound signals.

27. A sound processing device according to claim 26, wherein the processing means further acts to compute estimates of the input frequencies and transposed frequencies by use of a phase vocoder technique.

28. A sound processing device according to claim 15, wherein the processing means further acts to synthesise the amplified input sound signals at each of the plurality of input frequencies by performing an inverse Fourier transform on a set of complex frequency domain values, and correct the output signal at each of the transposed frequencies by correcting the complex frequency domain values before inverse Fourier transformation is performed.

* * * * *